(12) United States Patent
Hugo et al.

(10) Patent No.: US 11,415,616 B1
(45) Date of Patent: Aug. 16, 2022

(54) RF TEST HAT

(71) Applicant: The United States of America, as represented by the Secretary of the Navy, Arlington, VA (US)

(72) Inventors: Christian Hugo, Camarillo, CA (US); Gary Salvail, Camarillo, CA (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 350 days.

(21) Appl. No.: 16/810,232

(22) Filed: Mar. 5, 2020

(51) Int. Cl.
*G01R 29/10* (2006.01)
*H01Q 1/42* (2006.01)
*H01Q 15/02* (2006.01)
*H01Q 17/00* (2006.01)

(52) U.S. Cl.
CPC .............. *G01R 29/105* (2013.01); *H01Q 1/42* (2013.01); *H01Q 15/02* (2013.01); *H01Q 17/008* (2013.01)

(58) Field of Classification Search
CPC .... G01R 29/10; G01R 29/105; H01Q 1/1207; H01Q 1/42; H01Q 15/02; H01Q 17/00; H01Q 17/008
See application file for complete search history.

(56) References Cited

U.S. PATENT DOCUMENTS

| 3,806,943 | A | * | 4/1974 | Holloway | G01R 29/105 343/703 |
| 4,218,683 | A | * | 8/1980 | Hemming | H01Q 15/08 343/703 |
| 2014/0300519 | A1 | * | 10/2014 | Estebe | H01Q 17/00 343/703 |

FOREIGN PATENT DOCUMENTS

| CN | 104198837 | A | * | 12/2014 | ......... G01R 29/0821 |
| CN | 110190914 | A | * | 8/2019 | ......... H04B 17/0087 |
| KR | 101742195 | B1 | * | 5/2017 | |
| SU | 411556 | A1 | * | 1/1974 | |

OTHER PUBLICATIONS

How Apertures Affect EMI Shielding, Jan. 25, 2016, Leader Tech Inc website, available at https://leadertechinc.com/blog/how-apertures-affect-emi-shielding/ (Year: 2016).*

* cited by examiner

*Primary Examiner* — Dameon E Levi
*Assistant Examiner* — Leah Rosenberg
(74) *Attorney, Agent, or Firm* — Naval Air Warfare Center Weapons Division; Jimmy M. Sauz; James M. Saunders

(57) ABSTRACT

A radio frequency (RF) test hat. The RF test hat may comprise: a cylinder having forward and aft ends, end cap, arm and strap assembly, first and second absorber materials, a receiving antenna, and lens. The end cap may couple to the forward end of the cylinder. The arm and strap assembly may hingedly couple to the aft end of the cylinder and may be configured to mount the RF test hat onto a pod or transmitting antenna. The first absorber material may be located within the forward end of the cylinder. The second absorber material may be located near the aft end of the cylinder. The receiving antenna, which may be disposed within the first absorber material, may measure the intensity of a beam of electromagnetic radiation. The lens, which may be located within the middle portion of the cylinder, may spread the beam across a larger surface area of the first absorber material.

14 Claims, 6 Drawing Sheets

RF TEST HAT

STATEMENT REGARDING FEDERALLY SPONSORED RESEARCH OR DEVELOPMENT

The invention described herein may be manufactured and used by or for the government of the United States of America for governmental purposes without the payment of any royalties thereon or therefor.

FIELD OF USE

The present disclosure relates generally to test devices and apparatuses that block, absorb, or divert electromagnetic radiation from interfering with equipment and harming personnel.

BACKGROUND

Radio frequency (RF) and microwave testing is generally performed in labs or on the field to test beam characteristics of antennas and radiating systems. These tests, however, may expose personnel to dangerous levels of electromagnetic radiation and may cause interference to equipment during critical operations. In order to protect personnel and equipment, large metal containers may be positioned within the direct pathway of a beam of electromagnetic radiation emitted from the transmitting antenna under test. These larger containers are generally configured to absorb and capture the electromagnetic energy. Given that sufficient absorber material is needed to capture the RF energy and maintain a power density that would not damage the absorber material, these metal containers are large, heavy and often become extremely hot due to the absorption of concentrated RF energy. The absorber material may also degrade over time, which may unknowingly exposed personnel to dangerous levels of electromagnetic radiation. In this regard, there is a need for an apparatus that is compact and effective in absorbing dangerous levels of electromagnetic energy while reducing heat upon absorption.

SUMMARY OF ILLUSTRATIVE EMBODIMENTS

To minimize the limitations in the related art and other limitations that will become apparent upon reading and understanding the present specification, the following discloses embodiments of a new and useful radio frequency (RF) shield hat.

One embodiment may be an RF test hat, comprising: a cylinder being centered about a central longitudinal axis; an end cap removably coupled to a forward end of the cylinder, an absorber material located within the forward end of the cylinder; and a lens configured to spread a beam of an electromagnetic radiation, the lens being disposed within the cylinder. The lens may be tilted at an angle approximately 27° degrees with respect to the central longitudinal axis. The cylinder may further comprise one or more mesh screens. The one or more mesh screens may be longitudinally disposed between the forward end of the cylinder and the lens. Each opening of the one or more mesh screens may be less than approximately $1/20$ in length of a wavelength of a highest frequency of the beam of the electromagnetic radiation. The end cap may further comprise a test connector; wherein the RF test hat may further comprise a receiving antenna disposed within the absorber material and electrically coupled to the test connector.

Another embodiment may be an RF test hat, comprising: a cylinder being centered about a central longitudinal axis and having a forward end and an aft end; an end cap removably coupled to the forward end of the cylinder; an arm and strap assembly, comprising a strap and one or more arms hingedly coupled to the aft end of the cylinder and adapted to mount onto an antenna under test; a first absorber material located within the forward end of the cylinder; and a lens configured to spread a beam of an electromagnetic radiation, the lens being disposed within a middle portion of the cylinder. The lens may be tilted at an angle approximately 27° degrees with respect to the central longitudinal axis. The cylinder may further comprise upper and lower mesh screens. The upper and lower mesh screens may be longitudinally disposed between the forward end of the cylinder and the lens. Each opening of the upper and lower mesh screens may be less than approximately $1/20$ in length of a wavelength of a highest frequency of the beam of the electromagnetic radiation. The RF test hat may further comprise one or more second absorber material located near the aft end of the cylinder. The end cap may further comprise a test connector, wherein the RF test hat may further comprise a receiving antenna disposed within the first absorber material and electrically coupled to the test connector. The cylinder may be between approximately 30 and 50 inches in length.

Another embodiment may be an RF test hat, comprising: a cylinder being centered about a central longitudinal axis and having a forward end and an aft end; an end cap removably coupled to the forward end of the cylinder and comprising a test connector, an arm and strap assembly, comprising a strap and one or more arms hingedly coupled to the aft end of the cylinder and adapted to mount onto an antenna under test; a first absorber material located within the forward end of the cylinder, the first absorber material being substantially pyramidal in shape; one or more second absorber materials near the aft end of the cylinder, a receiving antenna disposed within the first absorber material and electrically coupled to the test connector, and a lens configured to spread a beam of an electromagnetic radiation and disposed within a middle portion of the cylinder, such that the lens spreads the beam across the first absorber material. The lens may be tilted at an angle approximately 27° degrees with respect to the central longitudinal axis. The cylinder may further comprise upper and lower mesh screens, both located at upper and lower portions of the cylinder, respectively. The upper and lower mesh screens may be longitudinally disposed between the forward end of the cylinder and the lens. Each opening of the upper and lower mesh screens may be less than $1/20$ in length of a wavelength of a highest frequency of the beam. The cylinder may be approximately 34 inches in length.

It is an object to overcome the limitations of the prior art.

These, as well as other components, steps, features, objects, benefits, and advantages, will now become clear from a review of the following detailed description of illustrative embodiments, the accompanying drawings, and the claims.

BRIEF DESCRIPTION OF THE DRAWINGS

The drawings are illustrative embodiments. They do not illustrate all embodiments. They do not set forth all embodiments. Other embodiments may be used in addition or instead. Details, which may be apparent or unnecessary, may be omitted to save space or for more effective illustration. Some embodiments may be practiced with additional components or steps and/or without all of the components or steps, which are illustrated. When the same numeral appears in different drawings, it is intended to refer to the same or like components or steps.

DETAILED DESCRIPTION OF ILLUSTRATIVE EMBODIMENTS

Figures 1A, 1B:
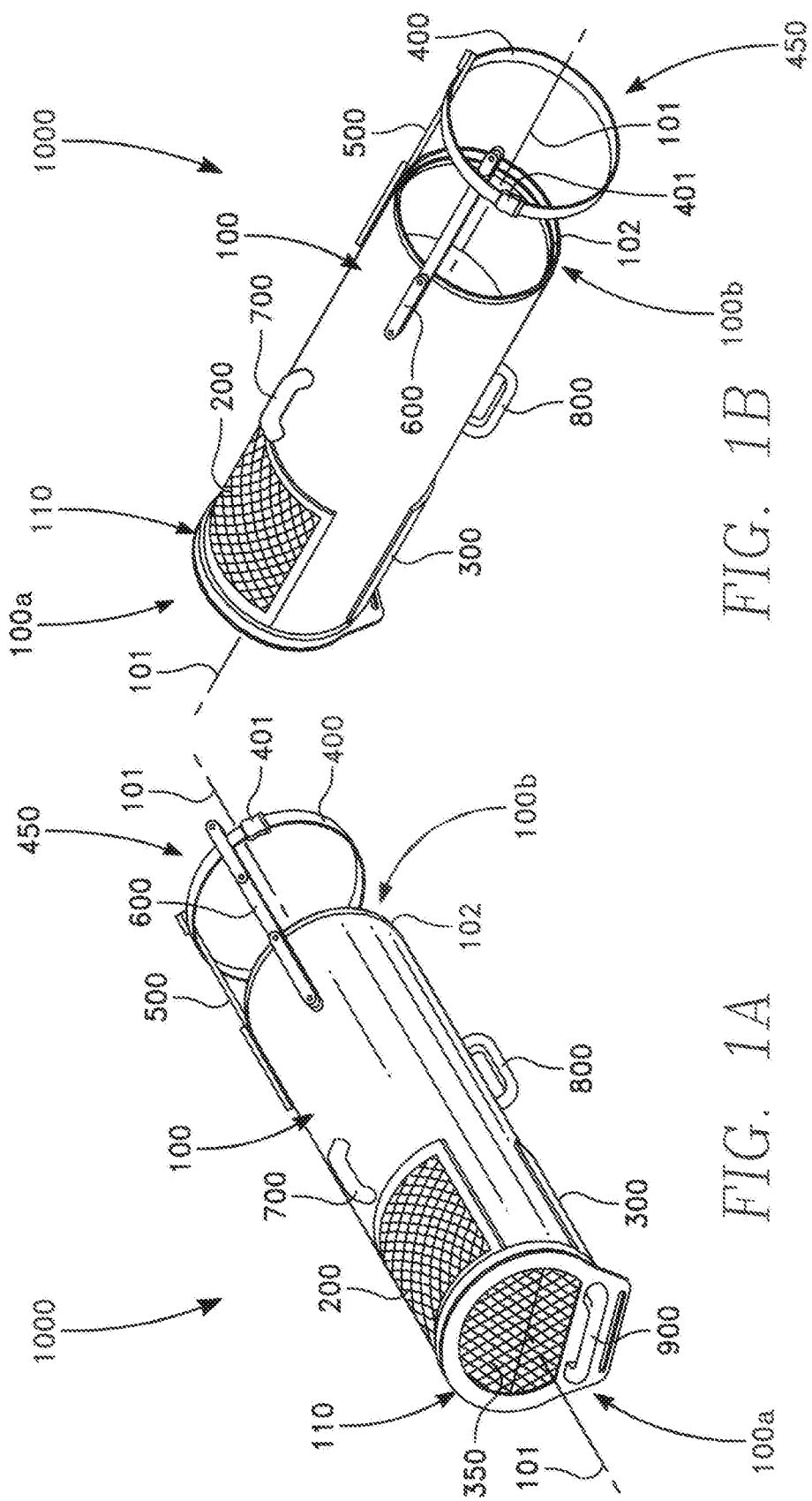
FIGS. 1A and 1B are illustrations of front and rear perspective views, respectively, of one embodiment of an RF test hat.

In the following detailed description, numerous specific details are set forth in order to provide a thorough understanding of various aspects of one or more embodiments of the RF test hat. However, these embodiments may be practiced without some or all of these specific details. In other instances, well-known methods, procedures, and/or components have not been described in detail so as not to unnecessarily obscure the aspects of these embodiments.

Before the embodiments are disclosed and described, it is to be understood that these embodiments are not limited to the particular structures, process steps, or materials disclosed herein, but is extended to equivalents thereof as would be recognized by those ordinarily skilled in the relevant arts. It should also be understood that the terminology used herein is used for the purpose of describing particular embodiments only and is not intended to be limiting.

Reference throughout this specification to "one embodiment," "an embodiment," or "another embodiment" may refer to a particular feature, structure, or characteristic described in connection with the embodiment of the present disclosure. Thus, appearances of the phrases "in one embodiment" or "in an embodiment" in various places throughout this specification may not necessarily refer to the same embodiment.

Furthermore, the described features, structures, or characteristics may be combined in any suitable manner in various embodiments. In the following description, numerous specific details are provided, such as examples of materials, fasteners, sizes, lengths, widths, shapes, etc. . . . to provide a thorough understanding of the embodiments. One skilled in the relevant art will recognize, however, that the scope of protection can be practiced without one or more of the specific details, or with other methods, components, materials, etc. . . . . In other instances, well-known structures, materials, or operations are generally not shown or described in detail to avoid obscuring aspects of the disclosure.

Definitions

In the following description, certain terminology is used to describe certain features of the embodiments of the RF test hat. For example, as used herein, unless otherwise specified, the term "substantially" refers to the complete, or nearly complete, extent or degree of an action, characteristic, property, state, structure, item, or result. As an arbitrary example, an object that is "substantially" surrounded would mean that the object is either completely surrounded or nearly completely surrounded. The exact allowable degree of deviation from absolute completeness may in some cases depend on the specific context. However, generally speaking, the nearness of completion will be so as to have the same overall result as if absolute and total completion were obtained.

The use of "substantially" is equally applicable when used in a negative connotation to refer to the complete or near complete lack of an action, characteristic, property, state, structure, item, or result. As another arbitrary example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "approximately" may refer to a range of values of 10% of a specific value.

As used herein, the term "near" refers to a region within close proximity of an intended point, position, or target. The term "near" may also refer to being at the intended point, position, or target.

As used herein the term "somewhat" refers to a range of values of 50% of a specific value.

As used herein, the term "about" is used to provide flexibility to a numerical range endpoint by providing that a given value may be "a little above" or "a little below" the endpoint. In some cases, the term "about" is to include a range of not more than about two inches of deviation.

By way of illustration, a numerical range of "about 1 inch to about 5 inches" should be interpreted to include not only the explicitly recited values of about 1 inch to about 5 inches, but also include individual values and sub-ranges within the indicated range. Thus, included in this numerical range are individual values such as 2, 3, and 4 and sub-ranges such as from 1-3, from 2-4, and from 3-5.

This same principle applies to ranges reciting only one numerical value and should apply regardless of the breadth of the range or the characteristics being described.

Distances, forces, weights, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited.

This same principle applies to ranges reciting only one numerical value and should apply regardless of the breadth of the range or the characteristics being described.

As used herein in this disclosure, the singular forms "a" and "the" may include plural referents, unless the context clearly dictates otherwise.

The present disclosure relates generally to test and shield devices that block, absorb, or divert electromagnetic radiation from interfering with equipment and harming personnel. In general, RF and microwave testing is performed in labs or on the field to test antennas and radiating systems. These tests, however, may expose personnel to dangerous levels of electromagnetic radiation and may cause interference to equipment during critical operations. In order to protect personnel and equipment, large, bulky metal containers (e.g. six to eight feet in length) may be positioned within the direct pathway of a beam of electromagnetic radiation emitted from a transmitting antenna. These containers are generally configured to absorb and capture the electromagnetic energy. Given that sufficient absorber material is needed to capture the RF energy and maintain a power density that would not damage the absorber material, these metal containers are large, heavy, and often become extremely hot due to the absorption of concentrated RF energy. As a result, these containers may require additional support when being positioned within direct view of the transmitting antenna, which may cause electromagnetic radiation to possibly leak out of the open end of the container. Further, the absorber material may also degrade over time, which may unknowingly exposed personnel to dangerous levels of electromagnetic radiation.

Embodiments of the RF test hat disclosed herein solve these problems by utilizing a lens that defocuses the beam of electromagnetic energy to spread across a larger surface area of the absorber material. This prevents the electromagnetic energy from being too concentrated on a single area, thereby reducing heat upon absorption. By spreading the electromagnetic energy before it interacts with the absorber material, the temperature of the absorber material preferably remains much lower, thereby allowing the RF test hat to use less absorber material and thus become smaller and compact in size (e.g., approximately 30 to 50 inches in length). As a result, unlike the conventional metal containers discussed above, embodiments of the RF test hat may be directly mounted on the transmitting antenna and thus be self-supporting due to the RF test hat's size and compactness. In this manner, the open end of the RF test hat may be substantially sealed during testing, thereby preventing and minimizing leakage of electromagnetic radiation. Additionally, mesh screens may be incorporated to allow trapped heat within the RF test hat to escape. These mesh screens may have openings with dimensions no more than ¹⁄₂₀ in length of a wavelength, thereby allowing for weight reduction as well as ventilation to keep the absorber from overheating. One embodiment of mesh screens, for example, may be a combination of upper and lower mesh screens to allow heat to escape via convection cooling. Accordingly, embodiments of the RF test hat may effectively absorb dangerous levels of electromagnetic energy and effectively reduce heat upon absorption of such energy.

In the accompany drawings, like reference numbers indicate like elements, Reference character 1000 depict various embodiments of the RF test hat.

FIGS. 1A and 1B are illustrations of front and rear perspective views, respectively, of one embodiment of an RF test hat 1000. As shown in FIGS. 1A and 1B, one embodiment of the RF test hat 1000 may comprise a cylinder 100, mesh screens 200, 300, 350, handles 700, 800, 900, and an arm and strap assembly 450, wherein the arm and strap assembly 450 may comprise a strap 400 and arms 500, 600. FIGS. 1A and 1B show that the cylinder 100 may be a substantially round and hollow container with a central longitudinal axis 101 and having a forward end 100a and aft end 100b. Importantly, the cylinder 100 may have a diameter sufficiently large to capture a beam of electromagnetic radiation emitted from an antenna under test (AUT). The cylinder 100 may be constructed of a conductive material (e.g., Aluminum, foil) or a composite material having conductive properties (e.g., carbon fiber). In various embodiments, the cylinder 100 may further comprise an edge trim 102 constructed of a rubber gasket or any soft and malleable material to protect the edge or surface of the RF test hat 1000 when strapped and mounted on the AUT. In other embodiments, the cylinder 100 may further comprise an end cap 110 that is detachable for ease of accessibility of the absorber material 120 (shown in FIGS. 4,5A, 5B) located within the forward end 100a of the cylinder 100.

The mesh screens 200, 300, 350 are preferably barriers with openings 201 (shown in FIG. 7) that allow gaseous communication between the interior and exterior of the cylinder 100. Preferably, the openings 201 allow heat to escape from the cylinder 100 to the atmosphere, and in an exemplary embodiment, each opening 201 is preferably no more than ¹⁄₂₀ of a wavelength in size to prevent electromagnetic radiation from escaping the mesh screens 200, 300, 350. Thus, mesh screens 200, 300, 350, as shown in the FIGS. 1A-5 and 7 are not drawn to scale. The mesh screens 200, 300, 350 may be constructed as a single piece of material or may be constructed of interwoven or connected strands of metal, fiber, or other flexible or ductile materials, similar to a web or netting structure.

Also shown in FIGS. 1A and 1B are upper and lower mesh screens 200, 300, which are preferably located at the upper and lower portions of the cylinder 100, respectively. This allows convection cooling which transfers heat or relatively warm air into a cooler region (e.g., atmosphere). Because heat rises, heat trapped in the cylinder 100 may escape the upper mesh screen 200, thereby creating negative air pressure that draws cooler air from beneath the cylinder 100 via the lower mesh screen 300. In various embodiments, the RF test hat 1000 may also include an end cap mesh screen 350 located at the end cap 110 to provide further ventilation.

The arm and strap assembly 450 may be a mechanism for securely mounting the RF test hat 1000 directly onto the AUT and may comprise a strap 400 and arms 500, 600. This may help prevent or minimize leakage of electromagnetic radiation from the aft end 100b of the cylinder 100 when mounted on the AUT. The strap 400 may be constructed of synthetic material for flexibility and elasticity and may be used to wrap around a pod or AUT. An alternative embodiment of the strap 400 may be a rigid band for securely coupling the RF test hat 1000 to the AUT. The strap 400 may further comprise a release buckle 401 for securely fastening the strap 400, but any other fasteners may be used such as hook and loop fasteners, buckles, and like.

The arms 500, 600 are preferably rigid strips of material for coupling the cylinder 100 to the strap 400 and are preferably sufficiently rigid to support the weight of the RF test hat 1000. In an exemplary embodiment, the arms 500, 600 are preferably attached to the aft end 100b of the cylinder 100 via hinges 103, and the hinges 103 are preferably configured to allow the arms 500, 600 to fold for ease of portability and transport. Altogether, the strap 400 and arms 500, 600 may be used to securely couple and mount the RF test hat 1000 onto the AUT.

The handles 700, 800, 900 are preferably structures used for grasping and holding the RF test hat 1000 during manual installation and operation. Exemplary embodiments of the handles 700, 800, 900 are preferably constructed of a polymer or plastic to prevent the handles 700, 800, 900 from overheating when used under the sun.

In operation, the user may first install the RF test hat 1000 by directly mounting the RF test hat 1000 onto the AUT. In various embodiments of the RF test hat 1000, the user may first unfold the arms 500, 600 via the hinges 103 and unlock the release buckle 401 or fastener of the strap 400. The user may also grasp the handles 700, 800, 900 in order to manually position or maneuver the RF test hat 1000 directly onto the AUT and within the transmitting view of the AUT. The user may also preferably fasten the RF test hat 1000 onto the AUT via fastening of the release buckle 401. In an exemplary embodiment, the absorber material 120 located within the forward end 100a of the cylinder 100 is preferably indirect view or "line of sight" of the AUT. Once the RF test hat 1000 is mounted onto the AUT, the user may perform various tests by emitting a beam of electromagnetic radiation towards the interior of the RF test hat 1000. A receiving antenna 107 (shown in FIG. 5A) located within the absorber material 120 is preferably used to measure the beam characteristics of the AUT. Such measurements may be accessed via the test connector 105 located at the end cap 110. In this manner, the user may measure and analyze waveform characteristics of the AUT via the RF test hat 1000.

Importantly, heat trapped within the RF test hat 1000 may escape through the openings 201 of the mesh screens 200, 300, 350 via convection cooling. Lens 250 located within the RF test hat 1000 may also reduce heat by spreading the beam of electromagnetic radiation across a larger surface area of the absorber material 120. This may assist in effectively reduce heat present within the RF test hat 1000.

Figure 2:
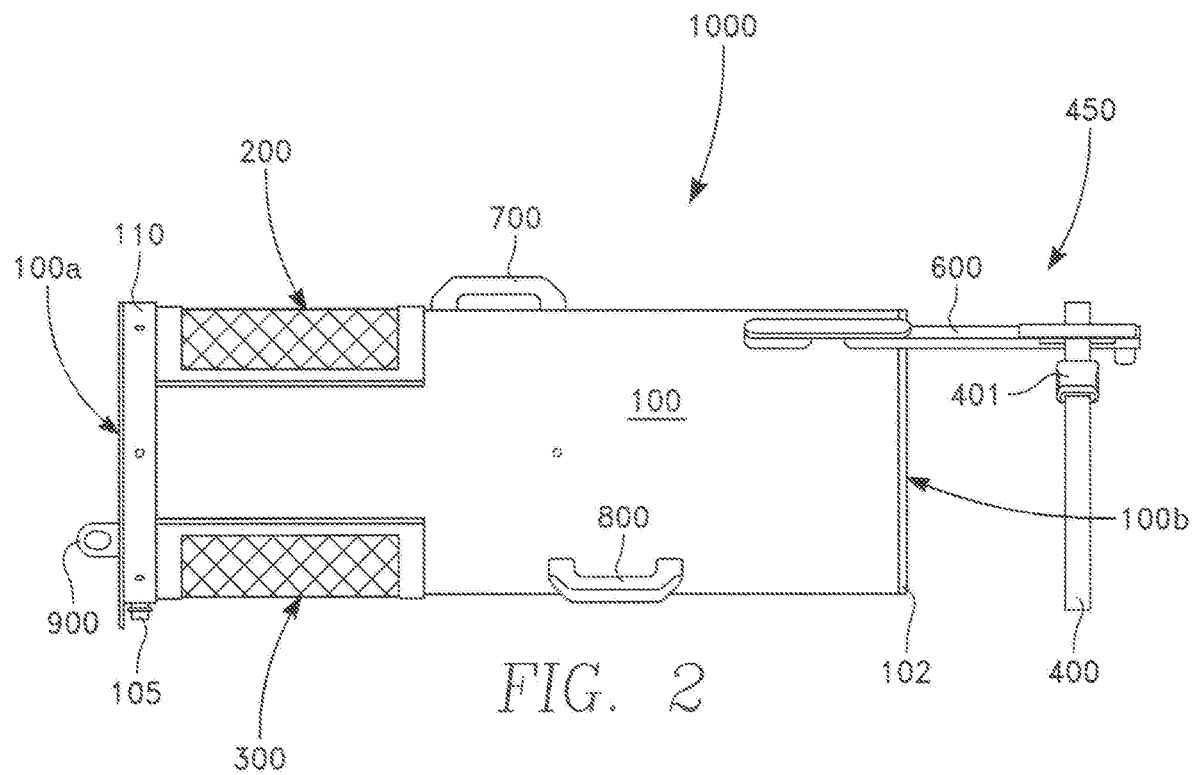
FIG. 2 is an illustration of a side elevation view of one embodiment of the RF test hat.

FIG. 2 is an illustration of a side elevation view of one embodiment of the RF test hat 1000. As shown in FIG. 2, one embodiment of the RF test hat 1000 may comprise a cylinder 100, mesh screens 200, 300, strap 400, arm 600, and handles 700, 800, 900.

Importantly, FIG. 2 shows that an embodiment of the RF test hat 1000 may further comprise a test connector 105 for providing access to beam and waveform measurements of electromagnetic radiation transmitted by the AUT. The test connector 105 may be adapted to provide electrical communication to interface with various test equipment such as oscilloscopes and spectrum analyzers, and the test connector 105 is preferably in electrical communication with the receiving antenna 107. As stated above, the receiving antenna 107 is preferably located within the absorber material 120 in order to directly measure beam characteristics.

Figure 3:
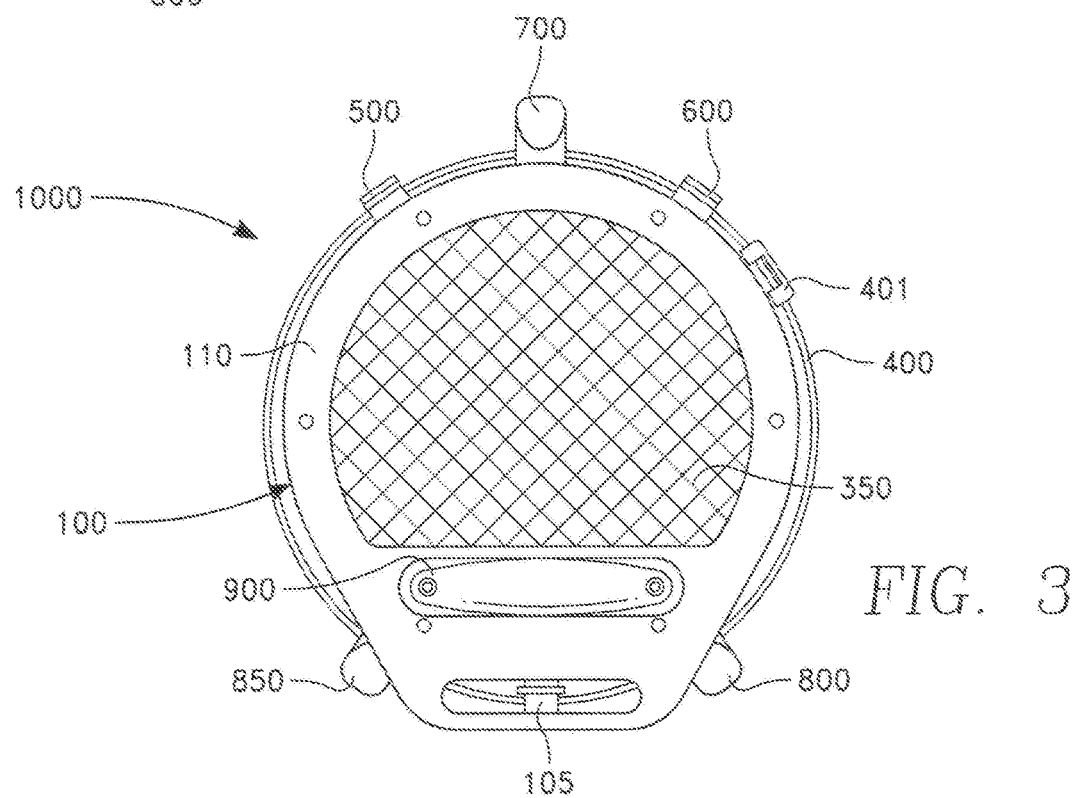
FIG. 3 is an illustration of a front elevation view of one embodiment of the RF test hat.

FIG. 3 is an illustration of a front elevation view of one embodiment of the RF test hat 1000. As shown in FIG. 3, one embodiment of the RF Test Hat 1000 may comprise a cylinder 100, arms 500, 600, handles 700, 800, 850, 900, and strap 400 with release buckle 401. Importantly, FIG. 3 shows that the RF test hat 1000 may comprise a mesh screen 350 on the end cap 110 and adjacent to the absorber material 120. This may provide additional ventilation to keep the absorber material 120 from overheating. FIG. 3 also shows that an additional handle 850 may also be used for better grasping of the RF test hat 1000 during manual installation and operation.

Figure 4:
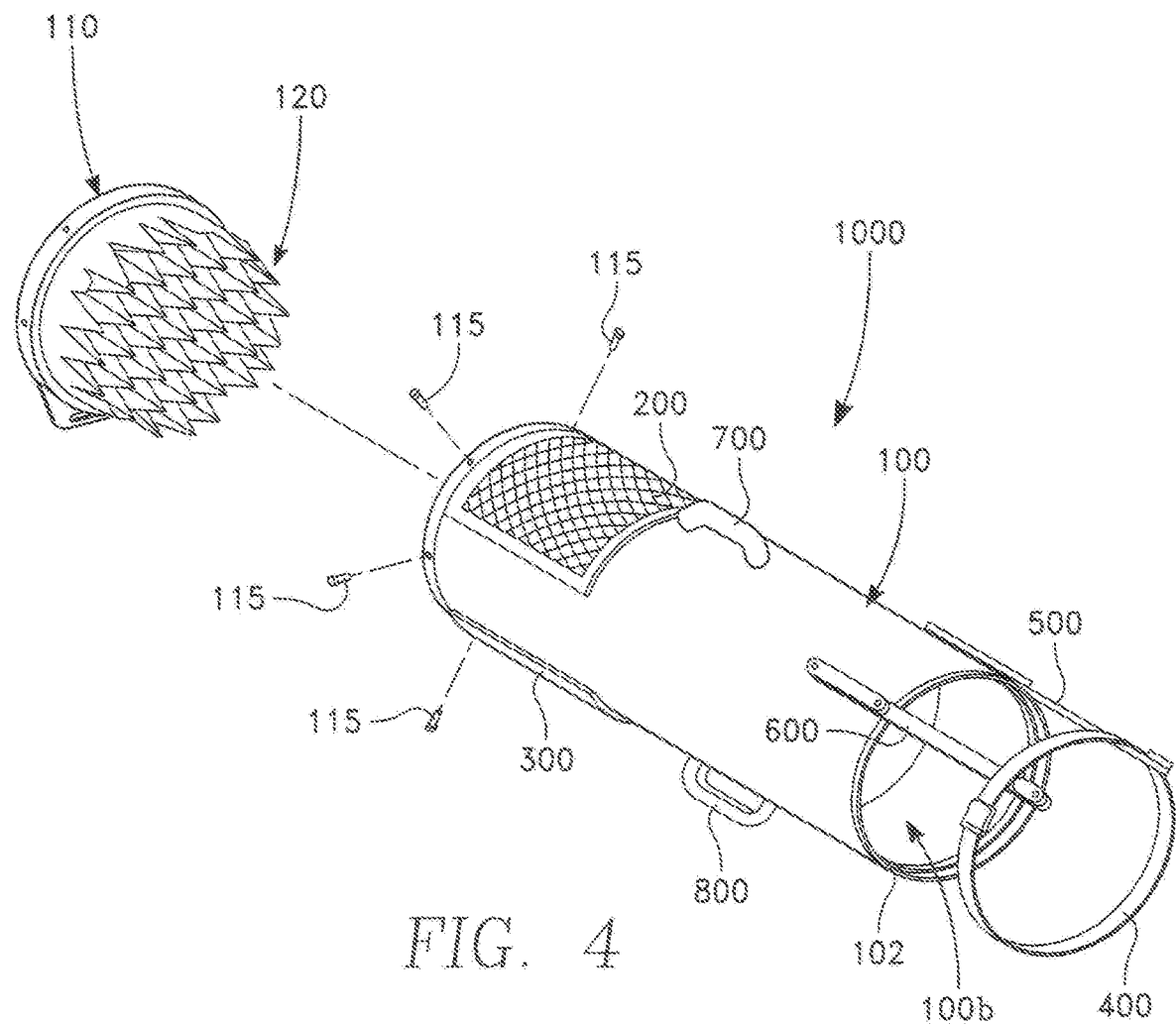
FIG. 4 is an illustration of a perspective view of one embodiment of the RF test hat and shows the end cap detached from the cylinder.

FIG. 4 is an illustration of a perspective view of one embodiment of the RF test hat 1000 and shows the end cap 110 detached from the cylinder 100. As shown in FIG. 4, one embodiment of the RF test hat 1000 may comprise a cylinder 100, end cap 110, screws 115, arms 500, 600, and handles 700, 800. Importantly, FIG. 4 shows that the RF test hat 1000 may comprise absorber material 120 adapted to absorb electromagnetic radiation or energy of an incident particle. Efficient absorption by the absorber material 120 may be achieved by utilizing pyramidal or conical projections and, in other embodiments, may be constructed with multilayered slabs. The absorber material 120 may also be impregnated with lossy carbon or other conductor adapted to absorb electromagnetic radiation in the RF frequency or microwave range, and the resistance loading field of the pyramidal layered absorber should taper gradually to match the impedance of the cylinder surface with the very high impedance of free space.

Finally, FIG. 4 shows that the end cap 100 may couple to the cylinder 100 by fastening screws 115 radially surrounding the forward end 100a of the cylinder 100.

Figure 5A:
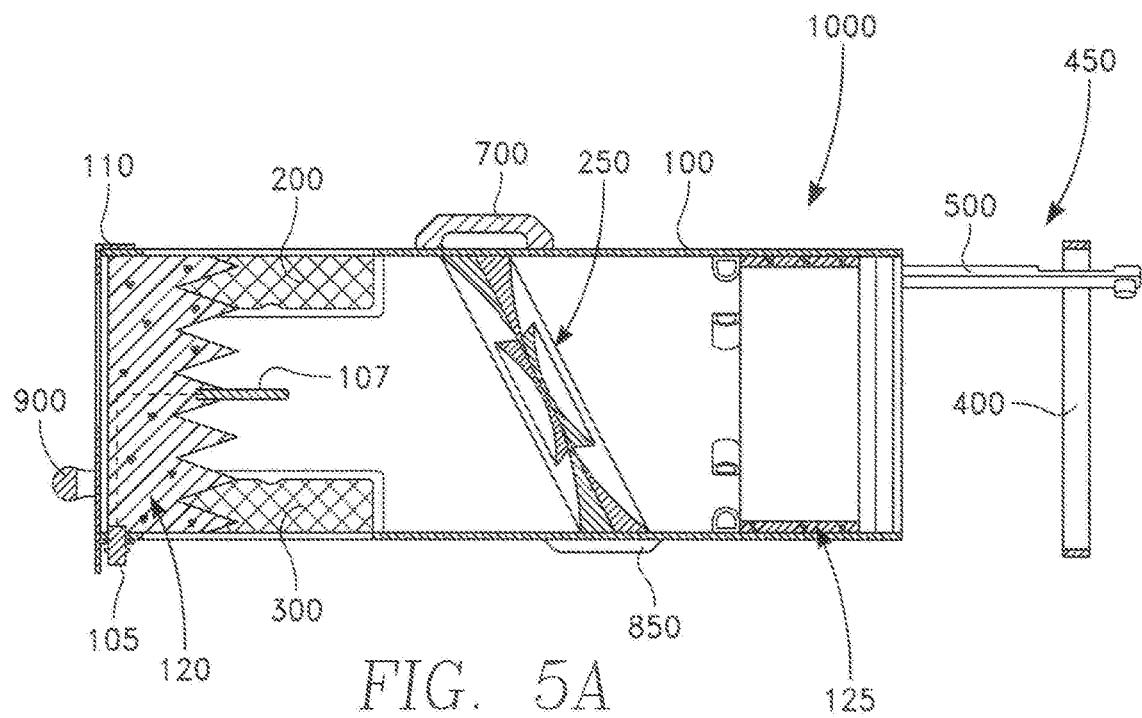
FIGS. 5A and 5B are illustrations of side elevation and perspective cross section views, respectively, of one embodiment of a RF test hat.
Figure 5B:
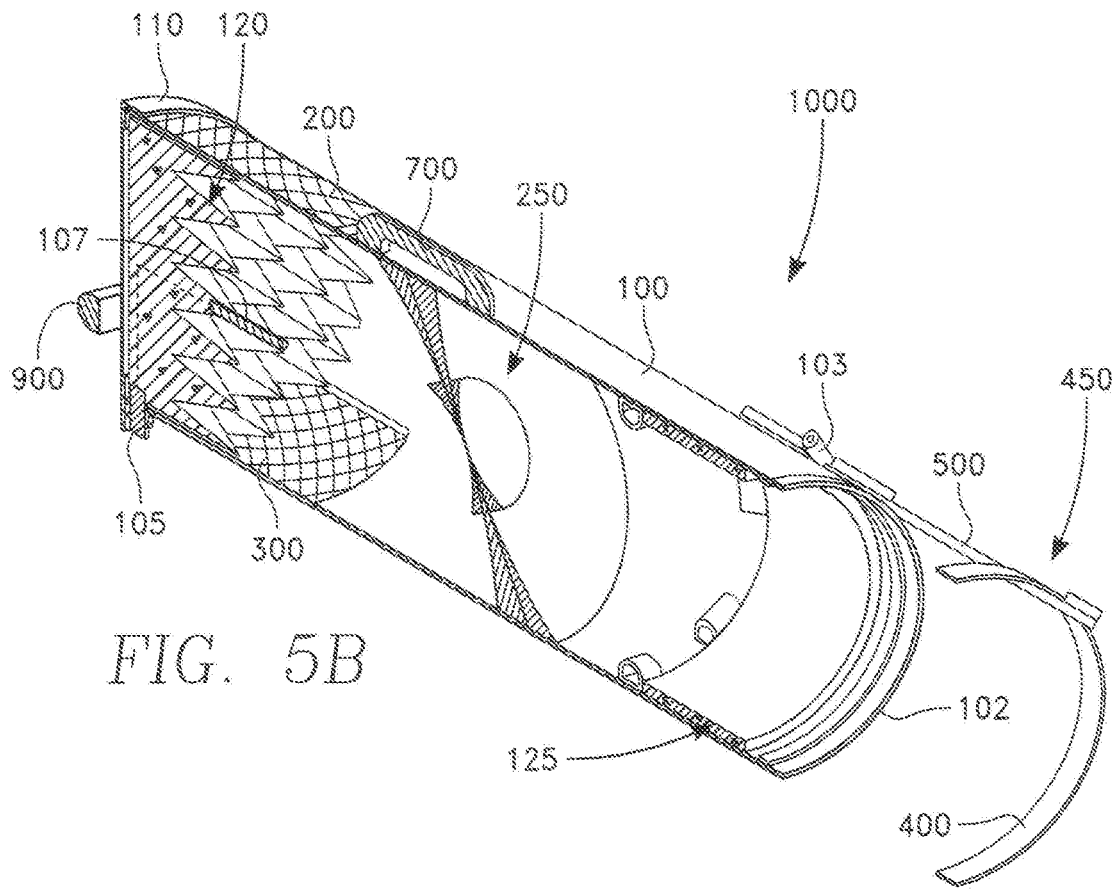

FIGS. 5A and 5B are illustrations of side elevation and perspective cross section views, respectively, of one embodiment of a RF test hat 1000. As shown in FIGS. 5A and 5B, one embodiment of the RF test hat 1000 may comprise a cylinder 100, end cap 110, a first absorber material 120, strap 400, arm 500, and handles 700, 850, 900. Importantly, FIGS. 5A and 5B show that the RF test hat 1000 may also comprise: a receiving antenna 107 electrically coupled to the test connector 105, second absorber material 125, and lens 250.

The receiving antenna 107 is preferably configured to capture electromagnetic signals (e.g., radio waves and microwaves) emitted by the AUT and converts those signals to electric signals. As shown in FIGS. 5A and 5B, the receiving antenna 107 may be electrically coupled to the test connector 105 to allow the user to measure and monitor waveforms during testing. Preferably, the length of the receiving antenna 107 accommodates the wavelength being transmitted by the AUT. The receiving antenna 107 is also preferably disposed within the first absorber material 120 and directly within transmitting range of the AUT.

Like the first absorber material 120, the second absorber material 125 preferably material that absorbs electromagnetic radiation. Given that some incidental electromagnetic radiation may escape through the aft end 100b of the cylinder 100, the second absorber material 125 is preferably located near the aft end 100b and adapted to absorb low intensity electromagnetic radiation. As a result, the second absorber material 125 may not necessarily utilize pyramidal or conical projections to match the impedance of the RF shield surface. Embodiments of the second absorber material 125 may also be impregnated with lossy carbon or other conductor adapted to absorb electromagnetic radiation in the RF frequency or microwave range.

The lens is preferably a transmissive optical component that disperses the beam of electromagnetic radiation by means of refraction. The lens 250 may consists of a single piece of transparent material or comprise several simple lenses or elements, usually arranged along a common axis. The lens 250 is preferably constructed of polycarbonate material and is preferably adapted to tilt at an angle approximately 27° degrees to reflect the electromagnetic radiation beam away from the transmitting antenna. The 27° degrees lens tilt may reduce electromagnetic energy bouncing back at the antenna under test. This may prevent the sensitive antenna transmitter from being damaged due to reflected energy. In general, the lens reflects little electromagnetic energy even at 0 degrees tilt. Through testing and simulation, a lens tilt of 27° degrees is a preferred angle, as it produces very little reflection. Additional details of the lens 250 is discussed in FIG. 6 below.

Figure 6:
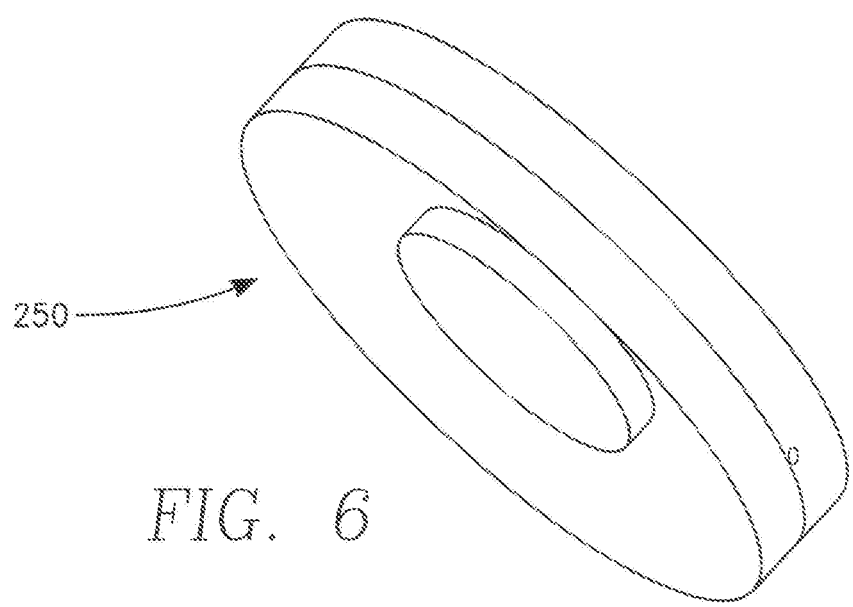
FIG. 6 is an illustration of one embodiment of a lens.

FIG. 6 is an illustration of one embodiment of a lens 250. As mentioned above, the lens 250 is preferably a transmissive optical component that disperses or spreads the beam of electromagnetic radiation by means of refraction. The lens 250 may consists of a single piece of transparent material or comprise several simple lenses or elements, usually arranged along a common axis. Here, as the beam of electromagnetic radiation makes contact with the lens 250, the beam may split via diffraction to spread the radiation (e.g., either from the shortest wavelength to the longest as with a prism or directly separating the beams uniformly in ranges). The radiation spread may arrive at the surface of the absorber material 120, and there, may contact a larger surface area to spread heat incident from the radiation beam.

In various embodiments, the lens 250 may be constructed from various transparent materials such as glass or plastic, but in a preferred embodiment, the lens 250 is preferably constructed of polycarbonate material. Importantly, the lens 250 is preferably adapted to tilt at an angle approximately 27° degrees to reflect the electromagnetic radiation beam away from the transmitting antenna. In another embodiment the lens 250, when installed in the RF test hat 1000, may be tilted at approximately 0° degrees with respect to the central longitudinal axis 101 of the cylinder 100. Examples of such lens may be double concave lens or Fresnel lens.

Figure 7:
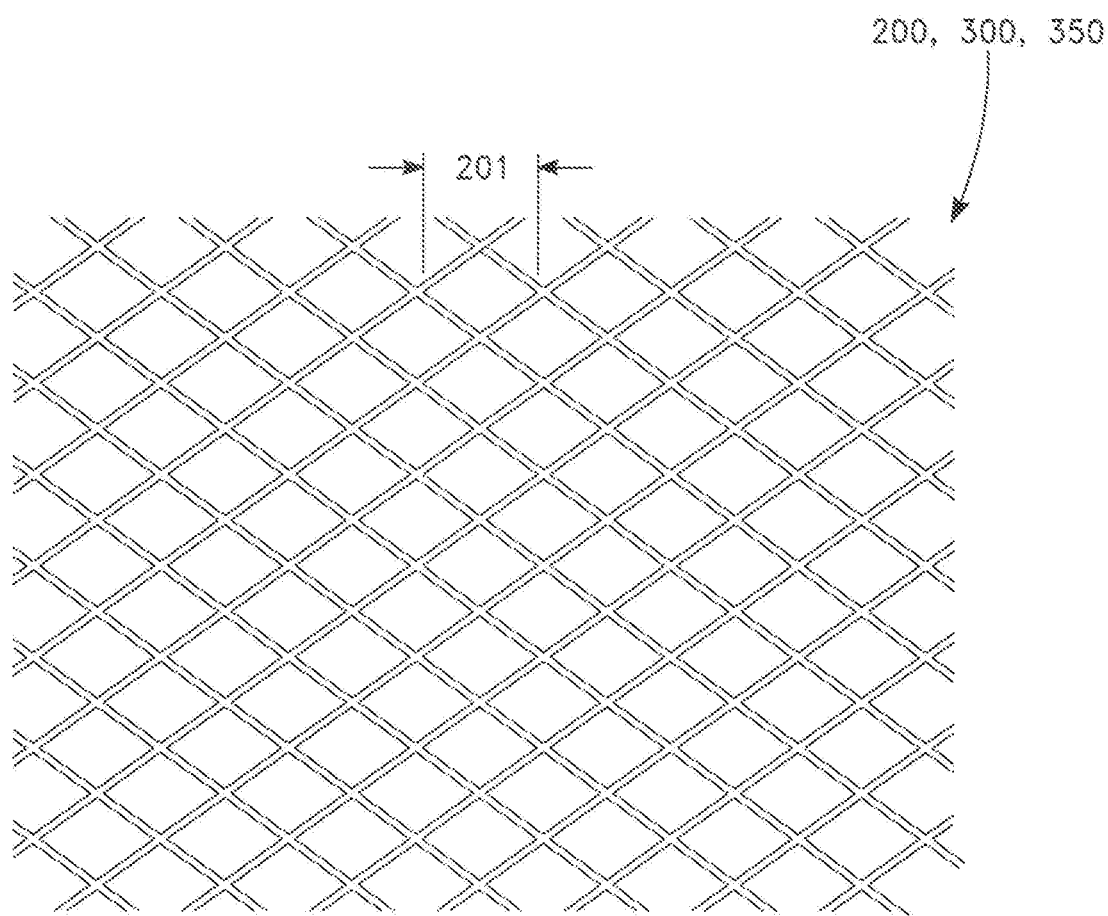
FIG. 7 is an illustration of a detailed view of one embodiment of a mesh screen.

FIG. 7 is an illustration of detailed view of one embodiment of a mesh screen 200, 300, 350. As shown in FIG. 7, one embodiment of a mesh screen 200, 300, 350 may be constructed as a single piece of material or may be constructed of interwoven or connected strands of metal, fiber, or other flexible or ductile materials. The mesh screen 200, 300, 350 may also have openings 201 for heat transfer from within the cylinder 100 to its exterior. As stated above, each opening 201 is preferably no more than 1/20 of a wavelength in size to prevent electromagnetic radiation from escaping the mesh screens 200, 300, 350. Additionally, the upper and lower mesh screens 200, 300 are preferably located at the upper and lower portions of the cylinder 100 to provide convection cooling. A mesh screen 350 located at the end cap 110 may also assist in further ventilation.

Figure 8A:
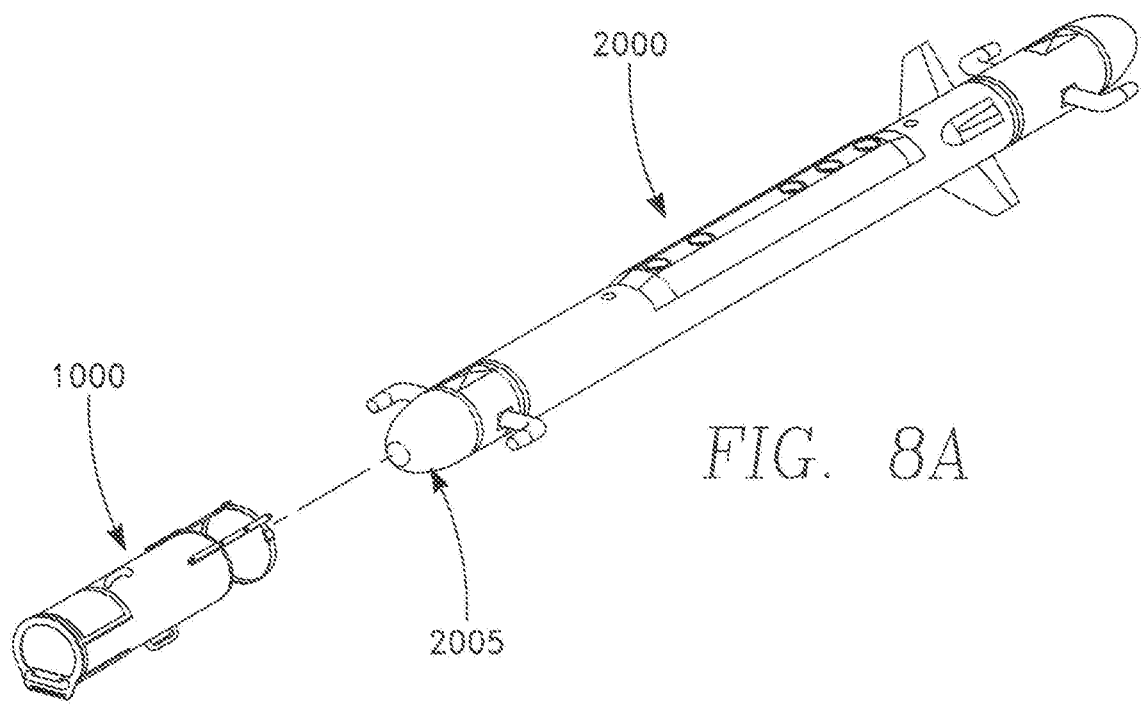
FIGS. 8A and 8B are illustrations of an exploded view and assembled view, respectively, of one embodiment of an RF test hat 1000 mounted onto a transmitting antenna.
Figure 8B:
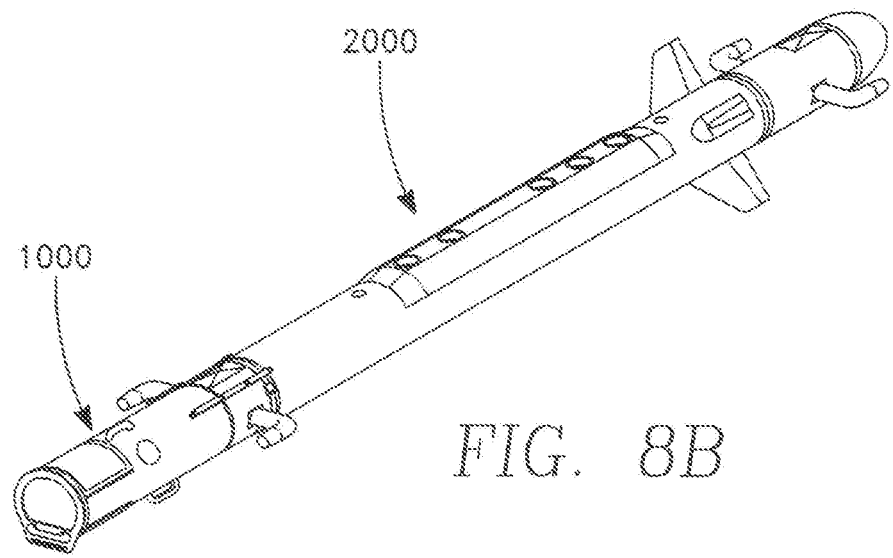

FIGS. 8A and 8B are illustrations of an exploded view and assembled view, respectively, of one embodiment of an RF test hat 1000 mounted onto a transmitting antenna 2005. Here, FIGS. 8A and 8B show that the RF test hat 1000 may be installed or mounted on a forward end portion of a pod 2000 via the arm and strap assembly 450. Specifically, the strap 400 may wrap around the transmitting antenna 2005 and may fastened via the release buckle or other type of fasteners (e.g., buckles, hook and loop fasteners, or the like). The aft end of the RF test hat 1000 may abut against the forward end of the pod 2000, and the edge trim 102 (e.g., rubber gasket) may protect the edge or surface of the RF test hat 1000 when strapped and mounted on the pod 2000. Importantly, FIGS. 8A and 8B show that the RF test hat 1000 substantially covers the forward end portion of the pod 2000. In this manner, the RF test hat 1000 may absorb and contain electromagnetic energy transmitted by the transmitting antenna 2005.

The foregoing description of the embodiments of the RF test hat has been presented for the purposes of illustration and description. While multiple embodiments of the RF test hat are disclosed, other embodiments will become apparent to those skilled in the art from the above detailed description. As will be realized, these embodiments are capable of modifications in various obvious aspects, all without departing from the spirit and scope of the present disclosure. Accordingly, the detailed description is to be regarded as illustrative in nature and not restrictive.

Although embodiments of the RF test hat are described in considerable detail, other versions are possible such as, for example, orienting and/or attaching the mesh screens or tilting the lens in a different fashion. Therefore, the spirit and scope of the appended claims should not be limited to the description of versions included herein.

Except as stated immediately above, nothing, which has been stated or illustrated, is intended or should be interpreted to cause a dedication of any component, step, feature, object, benefit, advantage, or equivalent to the public, regardless of whether it is or is not recited in the claims. The scope of protection is limited solely by the claims that now follow, and that scope is intended to be broad as is reasonably consistent with the language that is used in the claims. The scope of protection is also intended to be broad to encompass all structural and functional equivalents.

What is claimed as new and desired to be protected by Letters Patent is set forth in the appended claims:

1. An RF test hat, comprising:
   a cylinder being centered about a central longitudinal axis and having a forward end and an aft end;
   an end cap removably coupled to said forward end of said cylinder,
   an arm and strap assembly, comprising a strap and one or more arms hingedly coupled to said aft end of said cylinder and adapted to mount onto an antenna under test;
   a first absorber material located within said forward end of said cylinder; and
   a lens configured to spread a beam of an electromagnetic radiation, said lens being disposed within a middle portion of said cylinder.

2. The RF test hat, according to claim 1, characterized in that said lens is tilted at an angle approximately 270 degrees with respect to said central longitudinal axis.

3. The RF test hat, according to claim 1, characterized in that said cylinder further comprises upper and lower mesh screens.

4. The RF test hat, according to claim 3, characterized in that said upper and lower mesh screens are longitudinally disposed between said forward end of said cylinder and said lens.

5. The RF test hat, according to claim 3, characterized in that each opening of said upper and lower mesh screens is less than approximately 1/20 in length of a wavelength of a highest frequency of said beam of said electromagnetic radiation.

6. The RF test hat, according to claim 1, further comprising one or more second absorber material located near said aft end of said cylinder.

7. The RF test hat, according to claim 1, characterized in that said end cap further comprises a test connector; and
   wherein said RF test hat further comprises a receiving antenna disposed within said first absorber material and electrically coupled to said test connector.

8. The RF test hat, according to claim 1, characterized in that said cylinder is between approximately 30 and 50 inches in length.

9. An RF test hat, comprising:
   a cylinder being centered about a central longitudinal axis and having a forward end and an aft end;
   an end cap removably coupled to said forward end of said cylinder and comprising a test connector,
   an arm and strap assembly, comprising a strap and one or more arms hingedly coupled to said aft end of said cylinder and adapted to mount onto an antenna under test;
   a first absorber material located within said forward end of said cylinder, said first absorber material being substantially pyramidal in shape;
   one or more second absorber materials near said aft end of said cylinder;
   a receiving antenna disposed within said first absorber material and electrically coupled to said test connector; and a lens configured to spread a beam of an electromagnetic radiation and disposed within a middle portion of said cylinder, such that said lens spreads said beam across said first absorber material.

10. The RF test hat, according to claim 9, characterized in that said lens is tilted at an angle approximately 27° degrees with respect to said central longitudinal axis.

11. The RF test hat, according to claim 9, characterized in that said cylinder further comprises upper and lower mesh screens, both located at upper and lower portions of said cylinder, respectively.

12. The RF test hat, according to claim 11, wherein said upper and lower mesh screens are longitudinally disposed between said forward end of said cylinder and said lens.

13. The RF test hat, according to claim 11, characterized in that each opening of said upper and lower mesh screens is less than $\frac{1}{20}$ in length of a wavelength of a highest frequency of said beam.

14. The RF test hat, according to claim 9, characterized in that said cylinder is approximately 34 inches in length.

* * * * *